(12) United States Patent
Ogashiwa et al.

(10) Patent No.: US 11,626,334 B2
(45) Date of Patent: Apr. 11, 2023

(54) THROUGH-HOLE SEALING STRUCTURE (71) Applicant: TANAKA KIKINZOKU KOGYO K.K., Tokyo (JP)

(72) Inventors: Toshinori Ogashiwa, Hiratsuka (JP); Yuya Sasaki, Hiratsuka (JP); Masayuki Miyairi, Hiratsuka (JP)

(73) Assignee: TANAKA KIKINZOKU KOGYO K.K., Tokyo (JP)

( * ) Notice: Subject to any disclaimer, the term of this patent is extended or adjusted under 35 U.S.C. 154(b) by 1068 days.

(21) Appl. No.: 16/083,162

(22) PCT Filed: Apr. 6, 2017

(86) PCT No.: PCT/JP2017/014413
§ 371 (c)(1),
(2) Date: Feb. 12, 2019

(87) PCT Pub. No.: WO2017/183474
PCT Pub. Date: Oct. 26, 2017

(65) Prior Publication Data
US 2022/0102228 A1 Mar. 31, 2022

(30) Foreign Application Priority Data
Apr. 21, 2016 (JP) .............................. JP2016-084893

(51) Int. Cl.
*H01L 23/10* (2006.01)
*H01L 21/48* (2006.01)
*H01L 21/683* (2006.01)

(52) U.S. Cl.
CPC .......... *H01L 23/10* (2013.01); *H01L 21/4817* (2013.01); *H01L 21/6835* (2013.01)

(58) Field of Classification Search
CPC ....................................................... H01L 23/10
See application file for complete search history.

(56) References Cited

U.S. PATENT DOCUMENTS 6,528,875 B1  3/2003 Glenn et al.
2007/0144913 A1* 6/2007 Muraoka ................. C25D 7/12
                                                      205/183
(Continued)

FOREIGN PATENT DOCUMENTS

JP  2007-165494 A  6/2007
JP  2008-28364 A   2/2008
(Continued)

OTHER PUBLICATIONS

Extended European Search Report for European Application No. 17785816.4, dated Apr. 4, 2019.
(Continued)

*Primary Examiner* — Jay C Chang
*Assistant Examiner* — Mikka Liu
(74) *Attorney, Agent, or Firm* — Orrick, Herrington & Sutcliffe LLP; Joseph A. Calvaruso; K. Patrick Herman (57) ABSTRACT

A sealing structure including: a set of base members forming a sealed space; a through-hole which is formed in at least one of the base members, and communicates with the sealed space; and a sealing member that seals the through-hole. An underlying metal film including a bulk-like metal such as gold is provided on a surface of the base member provided with the through-hole. The sealing member seals the through-hole while being bonded to the underlying metal film, and includes: a sealing material which is bonded to the underlying metal film, and includes a compressed product of a metal powder of gold or the like, the metal powder having a purity of 99.9% by mass or more; and a lid-like metal film which is bonded to the sealing material, and includes a bulk-like metal such as gold. Further, the sealing material includes: an outer periphery-side densified region being in contact with an underlying metal film; and a center-side porous region being in contact with the through-hole. The (Continued)

densified region has a porosity of 10% or less in terms of an area ratio at any cross-section.

20 Claims, 4 Drawing Sheets

(56) References Cited

U.S. PATENT DOCUMENTS

| | | |
|---|---|---|
| 2009/0195125 A1 | 8/2009 | Matsugi |
| 2009/0309459 A1 | 12/2009 | Ogashiwa et al. |
| 2014/0009875 A1* | 1/2014 | Nakagawa ........ H01L 23/49827 |
| | | 361/679.01 |
| 2014/0239422 A1 | 8/2014 | Aoki |
| 2016/0272488 A1 | 9/2016 | Kaisha |

FOREIGN PATENT DOCUMENTS

| | | |
|---|---|---|
| JP | 2009-278562 A | 11/2009 |
| JP | 2015-95572 A | 5/2015 |

OTHER PUBLICATIONS

PCT, International Search Report for PCT/JP2017/014413, dated Jun. 6, 2017.

* cited by examiner

THROUGH-HOLE SEALING STRUCTURE

TECHNICAL FIELD

The present invention relates to a sealing structure that is applied to a package member required to be hermetically sealed, such as a MEMS device or a semiconductor device. Specifically, the present invention relates to a structure for hermetically sealing a sealed space by closing a through-hole of a base member provided with a through-hole communicating with a sealed space in which an element is mounted.

BACKGROUND ART

MEMS (micro electro mechanical systems) devices such as pressure sensors and acceleration sensors, and various semiconductor devices are used while being encapsulated in packages for preventing oxidation and degradation of elements by moisture and oxygen in air. In a process for manufacturing such a package, a cap as a lid is superposed on a base to which an element is fixed, and the cap and the base are bonded to perform hermetic sealing. A brazing material is welded to the cap beforehand, and the brazing material is melted again, and bonded to the base to form an inside sealed space.

When a base and cap are bonded by use of a brazing material as described above, the degree of vacuum and degree of cleanness of the inside of the space may be changed by release of a gas component contained in a very small amount during melting of the brazing material. Here, the degree of vacuum and degree of cleanness in the internal space of the hermetic sealing package are set at a level appropriate to an element to be applied. For some types of elements, even an extremely small amount of a gas component must not remain in a sealed space.

Thus, sealing structures for making it possible to adjust the degree of vacuum and degree of cleanness of the inside after formation of a sealed space include those in which a through-hole is set in a cap or a base beforehand. Among these sealing structures, a structure is known in which after a cap and a base are bonded, the inside of a sealed space is evacuated to vacuum, and a through-hole is filled with a brazing material to seal the through-hole (Patent Document 1).

RELATED ART DOCUMENT

Patent Documents

Patent Document 1: JP 2007-165494 A
Patent Document 2: JP 5065718 B2

SUMMARY OF THE INVENTION

Problems to be Solved by the Invention

With the above-mentioned sealing structure in which a through-hole is set, the degree of vacuum of a sealed space can be increased by performing an evacuation treatment after bonding of a base and a cap even if a gas component is released from a brazing material during the bonding. However, even in this sealing structure, there is a fear of being affected by a brazing material used for closing a through-hole. Although the use amount of a through-hole sealing brazing material is not so large, there may arise a problem when an element requiring a high degree of vacuum and degree of cleanness is sealed. In addition, the possibility that in sealing of the through-hole by a brazing material, the molten brazing material enters the inside of the sealed space, and is deposited on the element and damages the element in the worst case also causes the fear of being affected by a brazing material.

Further, the brazing material tends to involve a high working temperature depending on the type of the brazing material. Here, as a package sealing brazing material, an Au—Sn-based brazing material having favorable reliability and corrosion resistance is generally used. The Au—Sn-based brazing material has a melting point of about 280° C., and the sealing working temperature is often set to 300° C. or higher. From the viewpoint of protecting an element in a package, the temperature at which the package is heated is preferably low.

In recent years, various devices have been required to be downsized and thinned, and for meeting the requirement, processes for manufacturing the devices have been changed. As a method for mounting an element in a device, wafer-level packaging has increasingly replaced an existing method in which chips are packaged in individually manufactured base caps. The wafer-level packaging is a process in which operations ranging from installation of a sealing material to assembly of a device are completed on a wafer without separating the wafer into chips. Therefore, in the wafer-level packaging, a plurality of sealing regions are set for one wafer. It is necessary to simultaneously seal a plurality of sealing regions set for one wafer. Currently, a sealing method flexibly applicable to such a process is required.

The present invention has been made in view of the above-mentioned situations, and an object of the present invention is to provide a sealing structure for hermetically sealing a sealed space to which a through-hole is applied. The sealing structure suppresses contamination in the sealed space, and can be formed at a low temperature. In addition, a method capable of efficiently sealing a plurality of set sealed spaces as in a wafer-level packaging is revealed.

Means for Solving the Problems

The present invention provides a sealing structure including: a set of base members forming a sealed space; at least one through-hole which is formed in at least one of the set of base members, and communicates with the sealed space; and a sealing member that seals the through-hole. The sealing structure includes an underlying metal film on a surface of the base member in which the through-hole is formed, the underlying metal film including a bulk-like metal including at least one of gold, silver, palladium and platinum, the underlying metal film being formed so as to surround the peripheral part of the through-hole. The sealing member seals the through-hole while being bonded to the underlying metal film. The sealing member includes: a sealing material which is bonded to the underlying metal film, and includes a compressed product of a metal powder of at least one selected from gold, silver, palladium and platinum, the metal powder having a purity of 99.9% by mass or more; and a lid-like metal film which is bonded to the sealing material, and includes a bulk-like metal including at least one of gold, silver, palladium and platinum. The sealing material includes: an outer periphery-side densified region that is in contact with the underlying metal film; and a center-side porous region that is in contact with the through-hole. The densified region has a porosity of 10% or less in terms of an area ratio at any cross-section.

In the sealing structure according to the present invention, a compressed product of a predetermined metal powder is applied as a sealing member for sealing a through-hole. In this respect, the sealing structure according to the present invention is different from a conventional art mainly using a brazing material. Here, the applicant of the present application has already shown usefulness of the compressed product of a metal powder, which is applied in the invention of the present application, as a sealing material in Patent Document 2. According to Patent Document 2, a metal powder sintered body generated by applying and firing a metal paste including a solvent and a metal powder with a predetermined purity and particle size is used as a precursor of the metal powder compressed product. The metal powder sintered body as a precursor is pressurized to be densified, so that a metal powder compressed product is formed. As a mechanism of densification of the sintered body by pressurization, densification proceeds due to cooperation of a physical change that is plastic deformation and combination of the metal powder and a metal-structural change that is recrystallization caused by thermal energy. The metal powder compressed product thus formed can be expected to exhibit high airtightness, and is indicated to have a potential as a sealing member for a through-hole.

However, studies by the present inventors have revealed that when a metal powder sintered body is directly laid over a base member having a through-hole, and compressed, the sintered body at the peripheral part of the through-hole which is in contact with the base member is densified, but the sintered body facing the through-hole is not sufficiently compressed, and is not sufficiently densified. It has been confirmed that at the part of the sintered body which faces the through-hole, a porous structure remains, and in this state, sufficient airtightness is not secured.

Further, it has been confirmed that even for the densified sintered body at the peripheral part of the through-hole, the sintered body itself is densified to the extent that a sealing effect can be exhibited, but a gap may remain in the vicinity of a contact interface with the base member, resulting in insufficient airtightness.

Thus, the present inventors have conducted studies on a structure for hermetically sealing a through-hole reliably while a metal powder sintered body is used. As a result, it has been found that a sealing member having extremely high airtightness can be obtained by disposing two metal films: an underlying metal film and a lid-like metal film on and under a metal powder sintered body, then introducing the metal powder sintered body, and forming a metal powder compressed product from the metal powder sintered body.

When a porous material that is a metal powder sintered body is compressed while being in contact with a bulk-like metal film, not only a densified compressed product is formed, but also a very small gap already present before compression, at a contact interface with the metal film, is eliminated to improve adhesion. Therefore, sealability in the vicinity of the contact interface between the metal powder compressed product and the base member is secured. In addition, a region of the metal powder compressed product, which communicates with the through-hole, includes voids, the bulk-like metal film (lid-like metal film) that is in close contact with the region on the upper side exhibits airtightness as a firm lid. Thus, the present invention provides a sealing structure having as a main constitution a metal powder compressed product formed between two bulk-like metal films (underlying metal film and lid-like metal film) disposed on and under a metal powder sintered body.

Hereinafter, the constitutions of sealing structure according to the present invention will be described in detail. In the present invention, the concept of a set of base members forming a sealed space includes not only an independent package obtained by combining a base and a cap that form an hermetic sealing package, but also a combination of substrates in which a plurality of sealed spaces are set for simultaneously forming a plurality of hermetic sealing packages. This is because the present invention is a technique that is also applicable to a wafer-level packaging. A set of base members means a combination of two or more base members.

Specifically, the present invention relates to a sealing structure for closing and sealing a through-hole communicating with a sealed space, and is premised on existence of a through-hole formed in a base member. At least one through-hole may be set in the sealed space, and the position, size and shape of the through-hole are not limited. Further, which base member, in a set of base members forming the sealed space, involves the through-hole is not limited.

The sealing structure according to the present invention is formed by an underlying metal film provided so as to surround a through-hole, and a sealing member including a sealing material including a compressed product of a predetermined metal powder, and a lid-like metal film bonded to the sealing material. The underlying metal film is installed for securing adhesion to the base member of the sealing material to improve airtightness at a bonding interface with the base member. Preferably, the underlying metal film includes at least one of gold, silver, palladium and platinum. These metals are applied for exhibiting an adhesion state by mutually thermally diffusing the metals with a metal powder that is the sealing material. The purity of the underlying metal film is preferably high, but is not required to be as high as the purity of the metal powder compressed product. The purity is preferably 99% by mass or more. The underlying metal film is preferably a metal identical in material to the metal of the metal powder that forms a through-electrode. The underlying metal film includes a bulk body metal, and is preferably one formed by plating (electroplating or electroless plating), sputtering, vapor deposition, a CVD method or the like. In the present invention, the bulk body means a state for differentiating the metal powder compressed product and the metal powder sintered body as a precursor of the metal powder compressed product in the present invention, and is a so called bulk (block)-like metal. The bulk body is a metal manufactured by melting and casting, a precipitation method or the like, and means a dense metal having a density that is 0.97 times the density of the above-mentioned metal.

The underlying metal film may be configured to surround at least the peripheral part of the through-hole, and may be in the form of a frame or ring extending along the outer edge of the through-hole. Here, the width of the underlying metal film is preferably identical to that of the sealing material to be bonded. In addition, the underlying metal film may be formed over the whole surface of the base member.

The thickness of the underlying metal film is preferably not less than 0.01 μm and not more than 10 μm. This range shows the minimum thickness for securing adhesion to the base member, and the upper limit taking account of downsizing of the device.

In addition, the underlying metal film may be deposited directly on a surface of the base member, or deposited with other metal film interposed therebetween. The other metal film is a metal film for improving bondability to the base member of the underlying metal film. The material of the other metal film is preferably one including any of titanium, chromium, tungsten, a titanium-tungsten alloy, nickel, platinum and palladium. The other metal film is preferably one that is formed by plating, sputtering, vapor deposition, a CVD method or the like, and has a thickness of not less than 0.005 μm and not more than 10 μm.

The above-described sealing member bonded to the underlying metal film includes a sealing material and a lid-like metal film. The sealing material includes a compressed product of a metal powder of at least one selected from gold, silver, palladium and platinum, the metal powder having a purity of 99.9% by mass or more. The metal powder compressed product is preferably one formed by compressing a sintered body obtained by sintering a metal powder of at least one selected from gold, silver, palladium and platinum, the metal powder having an average particle size of not less than 0.01 μm and not more than 1.0 μm.

Since the sealing material is intended for closing the through-hole to hermetically seal the sealed space, the lateral cross-sectional area is larger than the lateral cross-sectional area of the through-hole as a matter of course. The area of the lateral cross-section of the sealing material is preferably not less than 1.2 times and not more than 6 times the area of the lateral cross-section of the through-hole. The thickness of the sealing material is preferably not less than 0.1 μm and not more than 10 μm. The lateral cross-sectional area is an area in the radial direction of the through-hole.

In the sealing structure according to the present invention, a lid-like metal film including a bulk-like metal including at least one of gold, silver, palladium and platinum is bonded to the sealing material. Airtightness of the sealing material on the upper side is secured by the lid-like metal film. Even after compression, the sealing material still has a porous structure at the central part that communicates with the through-hole as described above. The lid-like metal film serves as a member (i.e. lid) for completing sealing of the through-hole by sealing one end of the porous part.

In the lid-like metal film, a metal including at least one of gold, silver, palladium and platinum is applied for exhibiting a favorable adhesion state with a metal powder that is the sealing material. The purity of the lid-like metal film is preferably high, but is not required to be as high as the purity of the metal powder compressed product. The purity is preferably 99% by mass or more. It is preferable that the lid-like metal film includes a metal identical in material to the metal of the metal powder that forms the sealing material, and the lid-like metal film includes a bulk body metal, and is preferably one formed by plating (such as electroplating or electroless plating), sputtering, vacuum vapor deposition, a CVD method or the like. The thickness of the lid-like metal film is preferably not less than 0.01 μm and not more than 10 μm.

In the sealing structure according to the present invention, the outer periphery-side region that is in contact with the underlying metal film and the center-side region that is in contact with the through-hole in the sealing material including a metal powder compressed product are different in denseness. That is, the sealing material has a double structure including a barrel having a cross-sectional shape substantially identical to that of the through-hole, and a barrel covering an outer periphery-side surface of the foregoing barrel. In the present invention, the former is referred to as a porous region, and the latter is referred to as a densified region. In the porous region, a relatively large number of pores (voids) contained in the metal powder sintered body as a precursor of the compressed product remain. On the other hand, the densified region has a dense structure in which almost all pores are eliminated. The reason why there is a difference in denseness as described above is that in the process of forming the sealing material, the outer periphery-side densified region is pressurized while being sandwiched between both the underlying metal film and the lid-like metal film. The metal powder at a part that is in contact with the bulk-like metal film on the upper side and the lower side is pressurized from the upper side and the lower side, and thus plastically deformed and recrystallized uniformly, leading to an increase in denseness. On the other hand, a part situated on the upper side of the through-hole is pressurized from only the lid-like metal film on the upper side, and therefore at this part, voids of the sintered body remain.

Studies by the present inventors have revealed that in a sealing material including two regions different in denseness as described above, the ratio of pores (porosity) of one region: a densified region is regulated to exhibit a sealing action. Specifically, a densified region having a porosity of 10% or less in terms of an area ratio exhibits a sufficient sealing action. It is needless to say that in the metal powder compressed product, existence of pores is avoided for exhibiting a sealing action. Of course, the present inventors consider that the ratio of the pores is not necessarily required to reach or approximate 0%. The important matter in discussion of the sealing effect is whether or not pores are mutually connected to form continuous pores. Studies by the present inventors have revealed that in a compressed product formed from the metal powder sintered body applied in the present invention, the porosity allowable from the viewpoint of maintenance of sealing property is 10% at most in terms of an area ratio, and when the porosity exceeds 10%, connection of pores cannot be reliably suppressed, and thus functions as the sealing material are deteriorated. The porosity is more preferably 5% or less. The lower limit of the porosity is preferably 0% as a matter of course, but may be 0.1% from the viewpoint of efficiency of the sealing step and practicability.

It is not necessary to regulate the porosity of the porous region at the central part of the sealing material with respect to the porosity of the densified region. This is because the porous region is not expected to exhibit sealing property. However, when the densified region is formed in the present invention, the porosity of the porous region is often not less than 20% and not more than 30%. For reference, the porosity of the metal powder sintered body as a precursor is not less than 30% and not more than 40%, and therefore the porous region may be densified to some degree.

For measurement of the porosity, a cross-section is observed for each region, and the ratio of pores is appropriately measured on the basis of a photograph of structures of the cross-section. Observation of the cross-section here may be performed at any portion and in any direction. For calculation of the porosity, calculator software such as image analysis software may be used.

A method for hermetically sealing a package by use of the sealing structure according to the present invention will now be described. In the present invention, an underlying metal film is deposited on a base member provided with a through-hole, a sealing member of two-layer structure (i.e. sealing material/lid-like metal film) is bonded to the base member, and the through-hole is closed to airtightly a sealed space. The sealing material as a principal element of the sealing member is formed by compressing a metal powder sintered body. The metal powder sintered body as a precursor of the sealing material can be formed by sintering a metal paste in which a metal powder having a predetermined particle size is dispersed in a solvent. Thus, the underlying metal film is deposited in the through-hole of the base member, the metal paste is applied and sintered, the lid-like metal film is deposited, and pressurization is then performed to form the sealing structure according to the present invention. However, when a plurality of sealed spaces are formed on one base member as in a wafer-level packaging, sequential formation of sealing structures in individual through-holes is not efficient.

Thus, the present inventors have found a method capable of simultaneously sealing a plurality of through-holes taking advantage of the properties of the metal powder sintered body as a precursor of the sealing material. That is, the sealing method according to the present invention includes the steps of: providing a transfer substrate at a position corresponding to a position of a through-hole of a base member that forms a sealing region, the transfer substrate including a lid-like metal film, and a metal powder sintered body obtained by sintering a metal powder of at least one selected from gold, silver, palladium and platinum, the metal powder having a purity of 99.9% by mass or more and an average particle size of not less than 0.01 μm and not more than 1.0 μm; forming an underlying metal film on a surface of the base member provided with the through-hole, in such a manner that the underlying metal film surrounds at least the peripheral part of the through-hole; superposing the transfer substrate and the base member one on the other so as to be opposed to each other so that the through-hole is sealed with the metal powder sintered body being in contact with the underlying metal film; and pressing the transfer substrate to form a sealing material from the metal powder sintered body, and bond the sealing material to the underlying metal.

In the sealing method according to the present invention, a substrate (i.e. transfer substrate) that is a member different from a base member to be hermetically sealed is provided, and here a metal powder sintered body as a precursor of the sealing material is formed beforehand. In the sealing work, the transfer substrate is abutted against the base member, and pressurized, so that the formed sealing material is transferred to the base member while the metal powder sintered body is compressed. The sealing method using a transfer substrate is a process utilizing a phenomenon in which compression of a metal powder sintered body generates a strong bonding force to an underlying metal film formed on a base member to be sealed. The sealing method using a transfer substrate has such an advantage that by forming a plurality of lid-like metal films and metal powder sintered bodies on the transfer substrate beforehand, a base member provided with a plurality of through-holes can be sealed in one transfer operation. Hereinafter, the sealing method using a transfer substrate according to the present invention will be described.

The transfer substrate to be provided in the sealing method includes: a substrate; a projection portion formed at a position corresponding to a position of a through-hole of a base member that forms a sealing region; a lid-like metal film which is formed on at least the projection portion, and includes a bulk-like metal including at least one of gold, silver, palladium and platinum; and a sealing material which is formed on the lid-like metal film, and includes a sintered body obtained by sintering a metal powder of at least one selected from gold, silver, palladium and platinum, the metal powder having a purity of 99.9% by mass or more and an average particle size of not less than 0.01 μm and not more than 1.0 μm.

In addition, the transfer substrate for use in the present invention is preferably one including a transfer film containing an oxide film between the projection portion of the substrate and the lid-like metal film, in addition to the lid-like metal film and the metal powder sintered body. The transfer film is a metal film for adjusting bonding strength between the substrate and the lid-like metal film to be transferred from the base member. That is, as a substrate material of the transfer substrate, silicon, glass, ceramic or the like can be used, but a precious metal thin film of gold, silver, palladium, platinum or the like as the lid-like metal film has excessively low bonding strength to the constituent material of such a substrate. Thus, the lid-like metal film may be easily peeled off when formed directly on the substrate. Thus, a thin film of chromium, titanium, tungsten and an alloy of these metals, which have favorable bondability to both the substrate and the precious metal thin film, is formed to suppress peeling of the lid-like metal film. However, a metal thin film of chromium, titanium or the like has excessively high adhesion with a precious metal thin film, and therefore when these thin films are in direct contact with each other, a function as a transfer substrate is impaired. This is because in sealing work, the lid-like metal film and the sealing material must be moved (i.e. transferred) to the base member having a through-hole. Thus, a transfer film is obtained by forming an oxide film on a surface of a metal film of chromium or the like for adjusting adhesion with the lid-like metal film.

The transfer substrate described above can be manufactured by forming a projection portion at any position on a substrate, and sequentially stacking a transfer film, a lid-like metal film and a metal powder sintered body on the projection portion.

The substrate of the transfer substrate is a plate material formed of silicon, glass, ceramic or the like as described above. This substrate has a projection portion at a position corresponding to a position of a through-hole of a base member to be sealed. The projection portion is formed, and the sealing material etc. is formed on the projection portion, so that in a subsequent transfer process, such a portion is preferentially pressurized to effectively transfer the sealing material etc. In addition, it is easy to perform positioning of the transfer substrate.

The projection portion is preferably one having a cross-sectional area that is not less than 1.2 times and not more than 6 times the cross-sectional area of the corresponding through-hole. This is because the projection portion is a structural member for transferring the sealing material to the through-hole, and has almost the same size as that of the sealing material. The height of the projection portion is preferably not less than 1 μm and not more than 20 μm. For formation of the projection portion, a projection may be formed on the substrate by plating etc., or the substrate may be subjected to etching processing (such as dry etching or wet etching), grinding processing or the like to obtain a projection portion integral with the substrate.

The transfer film is a thin film including chromium, titanium, tungsten and an alloy of these metals, and can be formed by plating (such as electroplating or electroless plating), sputtering, vapor deposition, a CVD method or the like. After deposition of the metal film of chromium or the like, the substrate is once exposed to an oxidizing atmosphere in the air or an oxygen atmosphere to form an oxide film on a surface of the metal film. As oxidation conditions, it is preferable to expose the substrate to the air at a temperature ranging from room temperature to 200° C. for 1 hour to 24 hours. The thickness of the transfer film is preferably not less than 0.001 μm and not more than 0.1 μm, and the thickness of the oxide film in the transfer film is preferably not less than 0.0001 μm and not more than 0.01 μm.

After the transfer film is optionally formed, the lid-like metal film is formed. As described above, the lid-like metal film includes a bulk body metal of gold, silver, palladium or platinum with a purity of 99.9% by mass or more. Preferably, the lid-like metal film is formed by plating (such as electroplating or electroless plating), sputtering, vapor deposition, a CVD method or the like. The thickness of the lid-like metal film is preferably not less than 0.01 μm and not more than 10 μm.

The metal powder sintered body is obtained by sintering a metal powder of at least one selected from gold, silver, palladium and platinum, the metal powder having a purity of 99.9% by mass or more and an average particle size of not less than 0.01 μm and not more than 1.0 μm. The metal powder sintered body is formed by firing a metal paste including a metal powder having the above-described purity and particle size, and an organic solvent. The metal powder sintered body is a porous material in which the ratio of the density of the constituent metal powder to the density of the bulk metal (such as sintered body/bulk metal) is about 0.6 to 0.7. The reason why the purity of the metal powder is set to 99.9% or more is that consideration is given to acceleration of plastic deformation and recrystallization of metal particles in formation of a sintered body and compressed product. The reason why the average particle size of the metal powder is set to not less than 0.01 μm and not more than 1.0 μm is that when the particle size is less than 0.01 μm, the powder is easily aggregated in the metal paste, so that uniform coating is difficult. When the metal powder has a particle size of more than 1.0 μm, it is difficult to form a dense compressed product necessary for hermetic sealing.

As the organic solvent to be used in the metal paste, ester alcohol, terpineol, pine oil, butylcarbitol acetate, butylcarbitol, carbitol, isobornyl cyclohexanol (e.g. Terusolve MTPH as a product name: manufactured by Nippon Terpene Chemicals, Inc.), 2,4-diethyl-1,5-pentanediol (e.g. NIKO MARS as a product name: manufactured by The Nippon Koryo Yakuhin Kaisha, Ltd.), and dihydro-terpineol (e.g. NIKO MHD as a product name: manufactured by The Nippon Koryo Yakuhin Kaisha, Ltd.) are preferred. The metal paste may contain additives. The additives include at least one selected from an acryl-based resin, a cellulose-based resin and an alkyd resin. Examples of the acryl-based resin may include methyl methacrylate polymers, examples of the cellulose-based resin may include ethyl cellulose, and examples of the alkyd resin may include phthalic anhydride resins. These additives serve to suppress aggregation of the metal powder in the metal paste, so that the metal paste is made homogeneous. The added amount of the additive is preferably 2% by mass or less in terms of a ratio to the metal paste. Accordingly, the metal powder content can be made to fall within a range adequate for filling a through-hole while a stable aggregation suppressing effect is maintained. Preferably, the metal powder and the organic solvent in the metal paste are blended at a blending ratio of not less than 80% by mass and not more than 99% by mass for the metal powder, and not more than 1% by mass and not less than 20% by mass for the organic solvent.

The metal paste is applied to a substrate provided with a lid-like metal film, and is fired to form a metal powder sintered body. Depending on the blending ratio of the metal powder, the coating thickness of the metal paste is preferably not less than 1 μm and not more than 20 μm with consideration given to densification by subsequent sintering and pressurization. The method for applying the metal paste to the substrate is not particularly limited.

The heating temperature for generating the metal powder sintered body after application of the metal paste is preferably not lower than 150° C. and not higher than 300° C. When the heating temperature is lower than 150° C., the metal powder cannot be sufficiently sintered, and when the heating temperature is higher than 300° C., sintering excessively progresses, so that the metal powder is excessively hardened due to progress of necking between metal powders. As an atmosphere during firing, air, an inert gas (such as nitrogen, argon or helium), an inert gas containing hydrogen in an amount of not less than 1% and not more than 5%, or the like is selected. Further, the firing time is preferably not less than 30 minutes and not more than 8 hours. When the firing time is excessively long, there arises the problem that sintering excessively progresses, so that the metal powder is excessively hardened due to progress of necking between metal powders. Through the firing of the metal paste, the metal powder is sintered and solidified into a metal powder sintered body. The metal powder sintered body after the firing is a porous material having a density that is not less than 0.6 times and not more than 0.7 times the density of the bulk-like metal. Through the steps described above, a lid-like metal film, and a transfer substrate for forming and transferring the sealing material are obtained.

In the configuration of the transfer substrate, the separation film, the lid-like metal film and the metal powder sintered body (i.e. metal paste) may be formed on at least the projection portion of the substrate. This is because the sealing material etc. to be transferred may exist on at least the projection portion. However, the metal powder sintered body etc. may be formed on a substrate surface on the periphery of the projection portion. As described later, an area where the metal powder sintered body is densified into a compressed product is limited to a projection portion tip region between the lid-like metal film and the underlying metal film, and therefore there is no problem even when, for example, the metal powder sintered body, exists on the substrate surface on the periphery of the projection portion.

The sealing method using a transfer substrate according to the present invention will now be described. In this sealing method, a transfer substrate manufactured in the manner described above is prepared or acquired, and on the other hand, a sealed space is appropriately formed for a base member to be sealed. The form of the base member may be a single package including a base and a cap, or a combination of wafers having a plurality of sealed spaces as described above. In any of the forms, base members are combined to form a sealed space, and the inside of the sealed space is evacuated. In the present invention, examples of the method for bonding base members for forming a sealed space include, but are not limited to, brazing, anodic bonding, glass welding and metal paste bonding. In addition, when the sealed space is evacuated, the degree of vacuum and degree of cleanness are not limited at all. The degree of vacuum of the sealed space depends on performance of internal elements and required precision.

For the base member in which the sealed space is formed, an underlying metal film that surrounds at least a through-hole is formed. As described above, the underlying metal film includes a bulk-like metal including at least one of gold, silver, palladium and platinum. Preferably, the underlying metal film is formed by plating (electroplating or electroless plating), sputtering, vapor deposition, a CVD method or the like. The thickness of the underlying metal film is preferably not less than 0.01 μm and not more than 10 μm. The underlying metal film may be formed over the whole surface of the base member having the through-hole, or formed in a frame or ring shape at only the peripheral part of the through-hole with masking performed as appropriate. The underlying metal film may be formed before formation of the sealed space in the base member.

In the manner described above, the base member for which the sealed space and the underlying metal film are formed is pressurized with the transfer substrate abutted against the base member, so that a sealing material including a metal powder compressed product, and a lid-like metal are bonded and transferred to the underlying metal film on the base member to form a sealing structure according to the present invention. In the process for forming the sealing material, the metal powder sintered body sandwiched between the underlying metal film and the lid-like metal film is compressed and densified while being in close contact with these two bulk-like metal films. The metal powder sintered body is densified, and also firmly bonded to the underlying metal film. In this transfer step, the transfer substrate is pressurized preferably at not less than 80 MPa and not more than 200 MPa.

In addition, it is preferable that pressurization for transferring the sealing material is performed while at least one of the transfer substrate and the base member is heated. This is because recrystallization of the metal powder is accelerated to quickly form a dense sealing material. The heating temperature is preferably not lower than 80° C. and not higher than 300° C. The reason why sealing is possible at a relatively low temperature of 300° C. is that the metal powder sintered body, i.e. a sealing material capable of being densified at even a low temperature, is applied, and also, bulk-like metal films: the underlying metal film and the lid-like metal film are appropriately disposed.

After the sealing material is transferred, the transfer substrate is removed to form a sealing structure according to the present invention, so that hermetic sealing of the sealed space is completed. In the present invention, a gas component (i.e. organic solvent) is removed from the metal powder sintered body in the process of manufacturing the transfer substrate, so that the sealed space is not contaminated during transfer of the sealing material, and thus the degree of vacuum just before sealing can be maintained.

The metal powder may remain on the used transfer substrate. When the used transfer substrate is appropriately cleaned, and provided with the lid-like metal film etc., the transfer substrate can be reused.

Advantageous Effects of the Invention

As described above, a sealing structure according to the present invention is capable of sealing a through-hole at a relatively low temperature without contaminating a sealed space. A transfer substrate according to the present invention is capable of efficiently forming the sealing structure, and applicable even when a plurality of sealed spaces are set for one base member as in a wafer-level packaging.

DESCRIPTION OF EMBODIMENTS

First embodiment: Hereinafter, a preferred embodiment of the present invention will be described. In this embodiment, a test was conducted in which a through-hole of a base member was sealed after manufacturing of a transfer substrate and processing of the base member were performed with a metal powder as a sealing material, the metal powder including a metal having a purity of 99.9%.

(i) Manufacturing of Transfer Substrate

Figure 1:
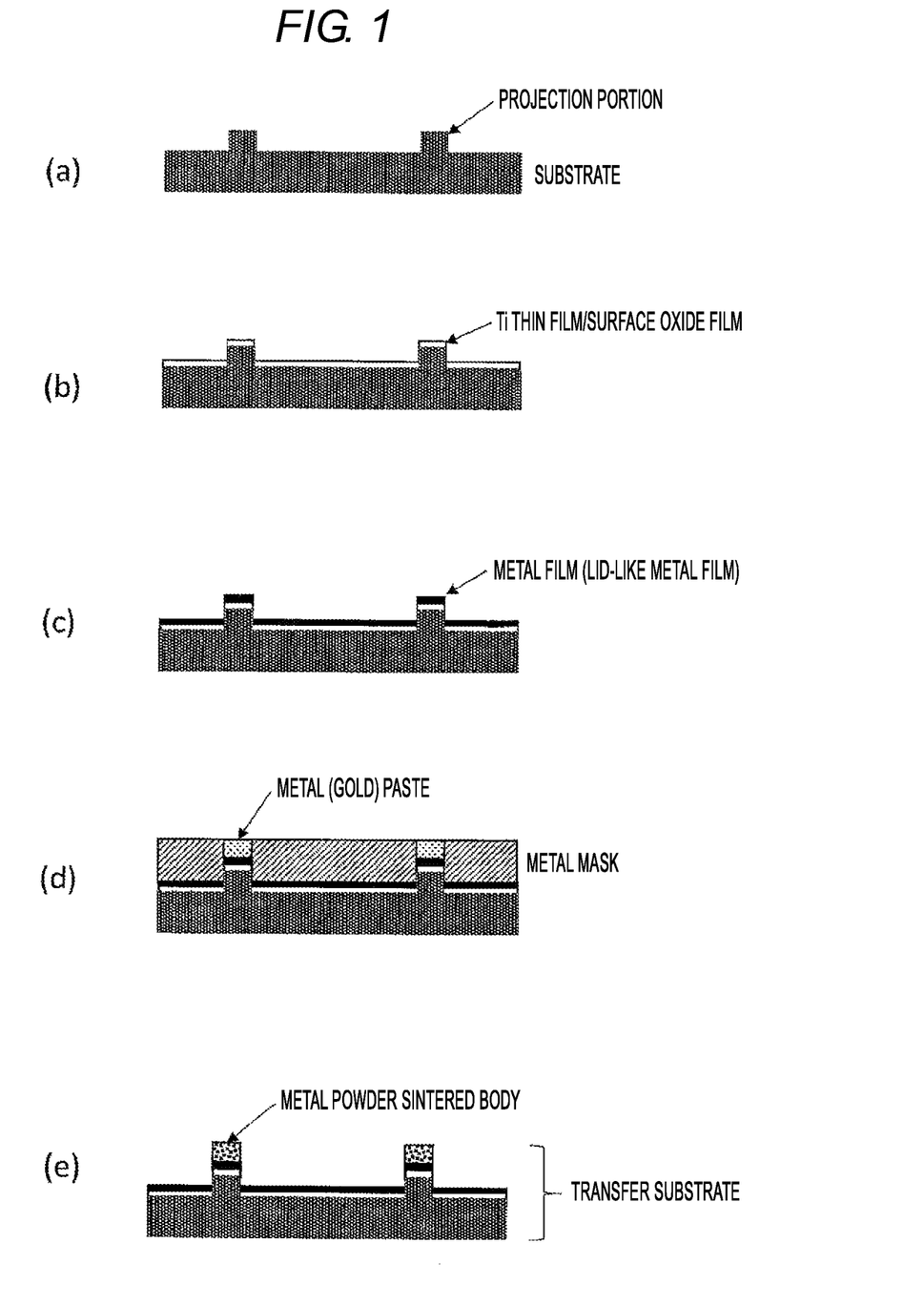
FIG. 1 illustrates a process for manufacturing a transfer substrate in a first embodiment.

FIG. 1 illustrates a process for manufacturing a transfer substrate in this embodiment. First, a silicon wafer substrate was provided, and a projection portion was formed by dry etching in conformation to the diameter and position (pitch) of the through-hole of the base member to be sealed (FIG. 1(a)). The projection portion is a columnar projection having a diameter of 500 μm and a height of 10 μm.

Next, as a transfer film, a titanium thin film (thickness: 0.05 μm) was deposited by sputtering on the top surface of the projection portion of the substrate. The titanium thin film was then exposed in the air at 25° C. for 24 hours to form an oxide film (having a thickness of about 0.005 μm) (FIG. 1(b)). After formation of the transfer film including titanium and the oxide film of titanium, gold was deposited as a lid-like metal film by sputtering (having a thickness of 0.5 μm, FIG. 1(c)). The titanium thin film (i.e. transfer film) and the gold thin film (i.e. lid-like metal film) were deposited over the whole surface of the substrate so as to reliably deposit each thin film on the top surface of the projection portion.

A metal paste was applied to form a metal powder sintered body on the substrate. As the metal paste, a metal paste prepared by mixing a gold powder (having an average particle size of 0.3 μm and a purity of 99.9%) manufactured by a wet reduction method with isobornyl cyclohexanol (i.e. Terusolve MTPH) as an organic solvent was used (with a mixing ratio of gold powder of 80% by mass). The metal paste was applied by a printing method with the substrate covered with a metal mask perforated so as to surround the projection portion (FIG. 1(d)). After application of the metal paste, the substrate was heated at 200° C. for 2 hours to sinter the metal powder, so that a 5 μm-thick metal powder sintered body was formed on the top surface of the projection portion to complete the transfer substrate (FIG. 1(e)).

(ii) Pretreatment of Base Member

Figure 2:
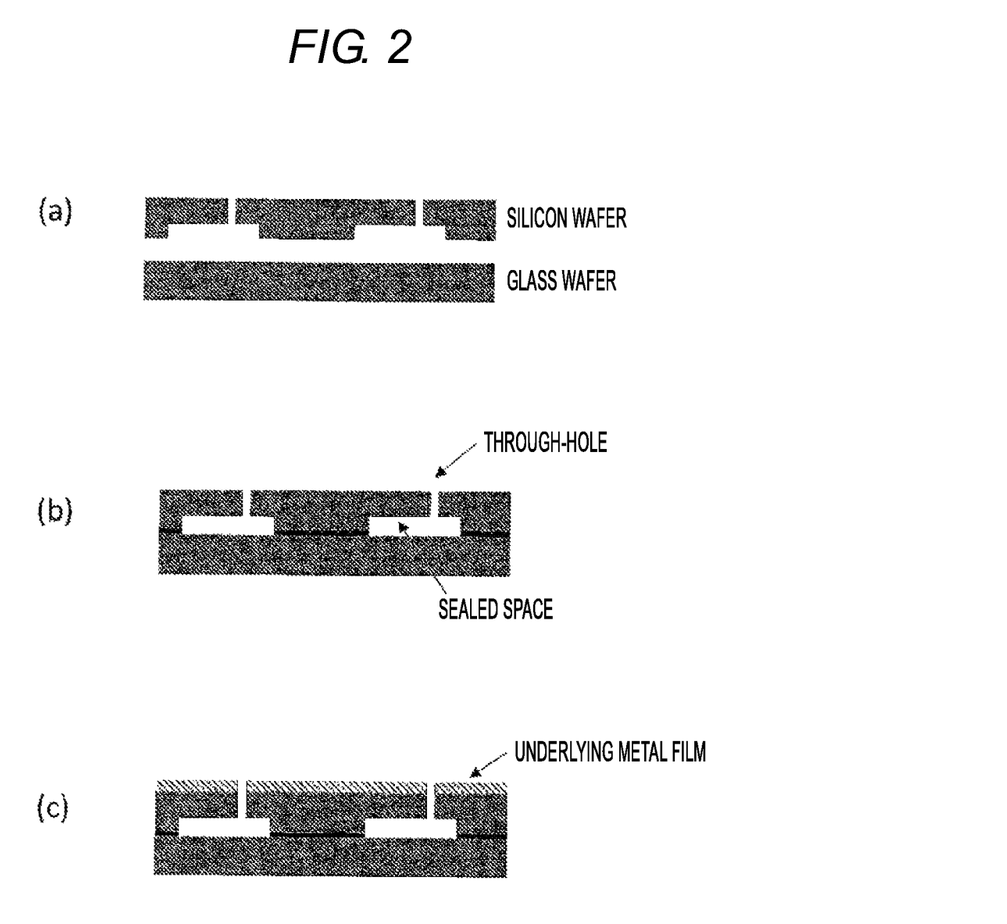
FIG. 2 illustrates a step of forming a base member (sealed space) in the first embodiment.

Base members to be subjected to a sealing treatment in this embodiment include a silicon wafer (as an upper base member) and a glass wafer (as a lower base member), and a sealed space is formed by a set of two substrates (FIG. 2(a)). The base members each have a thickness of 0.5 mm. A plurality of cavities (72 cavities) as sealed spaces are formed in the silicon wafer, and a through-hole communicating the cavities is formed. On the other hand, the glass wafer is a flat plate material. The cavity of the silicon wafer has a size of 2 mm square, and the through-hole is a hole having a circular cross-section with a diameter of 0.1 μm.

For formation off the sealed space, the silicon wafer and the glass wafer were positioned, and then bonded together by anodic bonding that is a conventional art (FIG. 2(b)). A bond aligner (BA 8 manufactured by SÜSS MICROTEC SE.) was used for the positioning, and a wafer holder (SB 8e manufactured by SÜSS MICROTEC SE.) was used for the anodic bonding. As bonding conditions, the wafers were bonded at 400° C. and −800 V for 30 minutes under a low pressing pressure in a vacuum atmosphere (10 Pa).

After the base members were bonded to form a sealed space, gold was deposited as an underlying metal film on the periphery of the through-hole of the silicon wafer (FIG. 2(c)). In this embodiment, the underlying metal film was formed over the whole surface of the wafer, a titanium/platinum film was formed for securing adhesion, and gold was then sputtered. The gold film has a thickness of 0.5 µm.

(iii) Hermetic Sealing of Sealed Space

The through-hole of the sealed space of the base member was sealed by use of the transfer substrate manufactured in (i). For matching the positions of the transfer substrate and the base member, a bond aligner (BA 8 manufactured by SÜSS MICROTEC SE.) was used to perform positioning so that the projection portion of the transfer substrate corresponded to the through-hole as in FIG. 3(a). Thereafter, by use of a wafer holder (SB 8e manufactured by SÜSS MICROTEC SE.), the pressure was reduced to a vacuum atmosphere (10 Pa), the transfer substrate was then abutted against the base member, and pressurized, and the transfer substrate and the base member were heated by a tool with a heater. Here, as a transfer condition, the pressure of the top surface of the projection portion was 100 MPa, and as a heating condition, heating was performed to 200° C. at a temperature elevation rate of 30° C./min.

Figure 3:
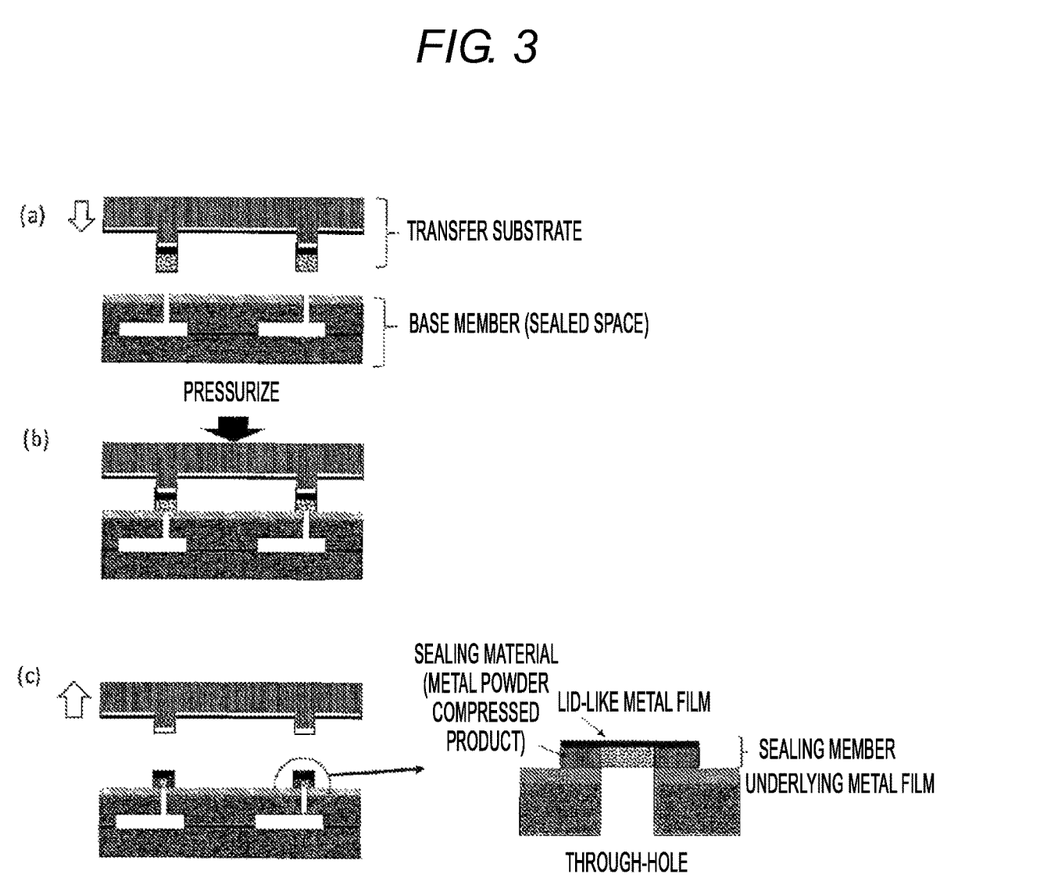
FIG. 3 illustrates a step of sealing the sealed space by use of the transfer substrate in the first embodiment.

After the temperature of the transfer substrate reached 200° C., the transfer substrate was held for 30 minutes while being loaded (FIG. 3(b)). Thereafter, the transfer substrate was unloaded, and moved. Observation of the base member after removal of the transfer substrate revealed that the sealing member and the lid-like metal film of the transfer substrate were bonded to the through-hole (FIG. 3(c)). The sealing material was compressively deformed, and had a thickness of 2 µm.

Figure 4:
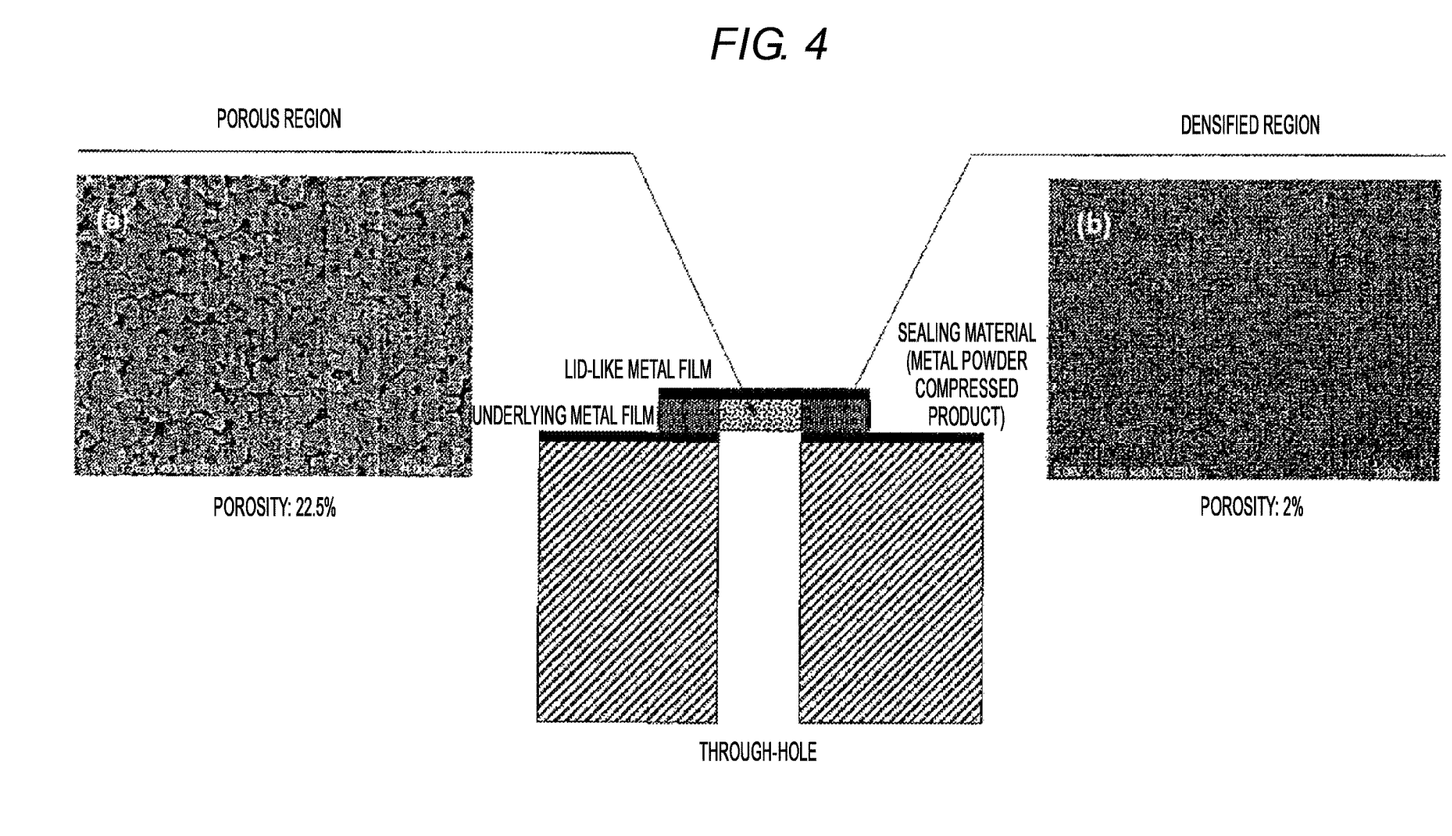
FIG. 4 is a SEM photograph showing cross-section structures of the sealing material formed in the first embodiment.

FIG. 4 shows photographs of cross-sections of a densified region at an outer peripheral part and a porous region at a central part of the metal powder compressed product as a sealing material for the sealing structure formed in this embodiment. These photographs are photographs where a cross-section of the prepared sealing structure is processed and polished by a focused ion beam apparatus (FIB), and observed by SEM (30,000 fold, inclined to 45°). FIG. 4 revels a difference in densification degree between the densified region and the porous region. In the porous region, a plurality of pores (or voids) are continuously connected. On the other hand, the densified region also has very small pores, but these pores are isolated from one another. Since pores are not connected, it is expected that the action of hermetic sealing is sufficient.

On the basis of the photographs of FIG. 4, the porosity was measured for each of the densified region and the porous region. In this embodiment, the SEM image in FIG. 4 was processed by image analysis software (under the trade name "AZOKUN (ver. 2.50)" manufactured by Asahi Kasei Engineering Corporation.) to calculate the porosity. In image analysis, the image was subjected to binarization processing to separate pores and metal particles, and the area ratio of pore portions was calculated, and defined as a porosity. The result of the image analysis showed that in this embodiment, the porosity of the densified region was 2.0%, and the porosity of the porous region was 22.5%.

Next, airtightness of the sealed space was examined for the base member, the through-hole of which was sealed. For the examination, a helium leak test (bell jar method) was conducted. In this evaluation, samples having a helium leak rate of $10^{-9}$ Pa·m³/s were rated acceptable, and the helium leak rate in this embodiment was $10^{-11}$ Pa·m³/s to $10^{-13}$ Pa·m³/s. The result showed that in the sealing structure of this embodiment, the sealed space was hermetically sealed effectively.

Second embodiment: Here, effects with a difference in constituent material of the sealing material and presence/absence of the underlying metal film and the lid-like metal film were examined with a base member (i.e. sealed space) identical to that in the first embodiment. A transfer substrate was prepared while the solvent and the metal content of the metal paste were the same as in the first embodiment, and the particle size and the type of the metal powder were changed. In the same manner as in the first embodiment, a silicon wafer (as an upper base member) and glass wafer (as a lower base member) were bonded to form a sealed space, so that the through-hole of the base members was sealed. In some tests, a low load was employed such that the pressure of the top surface of the projection portion was 70 MPa. Table 1 shows the configurations of various sealing structures manufactured by way of trial in this embodiment and the results of the leak test.

TABLE 1

| | Sealing material | | Underlying metal film | | Lid-like metal film | | Porosity of sealing material | | Results of sealing test | |
| | | | | | | | Densified region | Porous region | | |
| No. | Metal powder | Particle size | Metal | Thickness | Metal | Thickness | (peripheral part) | (central part) | Leak rate (Pa · m³/s) | Evaluation |
| 1 | Au | 0.3 µm | Au | 0.5 µm | Au | 0.5 µm | 2.0% | 22.5% | $10^{-11}$ to $10^{-13}$ | Acceptable[*1] |
| 2 | | 0.01 µm | | | | | 2.5% | 23.0% | $10^{-11}$ to $10^{-13}$ | Acceptable |
| 3 | | 1.0 µm | | | | | 7.0% | 24.0% | $10^{-9}$ to $10^{-11}$ | Acceptable |
| 4 | | 1.2 µm | | | | | 11.0% | 24.0% | $10^{-5}$ to $10^{-8}$ | Unacceptable |
| 5 | | 0.3 µm | | 0.01 µm | | 10 µm | 2.0% | 23.0% | $10^{-11}$ to $10^{-13}$ | Acceptable |
| 6 | | | | 10 µm | | 0.01 µm | 2.2% | 22.5% | $10^{-9}$ to $10^{-11}$ | Acceptable |
| 7 | | | Ag | 0.5 µm | Ag | 0.5 µm | 2.1% | 22.5% | $10^{-11}$ to $10^{-13}$ | Acceptable |
| 8 | | | None | — | Au | 0.5 µm | 2.2% | 25.0% | Sealing impossible[*3] | Unacceptable |
| 9 | | | Au | 0.5 µm | None | — | 2.3% | 26.0% | Sealing impossible[*3] | Unacceptable |
| 10 | | | Au | 0.5 µm | Au | 0.5 µm | 12.0% | 29.0% | $10^{-5}$ to $10^{-8}$ | Unacceptable[*2] |
| 11 | Ag | 0.3 µm | Ag | 0.5 µm | Ag | 0.5 µm | 3.5% | 24.0% | $10^{-9}$ to $10^{-11}$ | Acceptable |
| 12 | | | Au | | Au | | 3.4% | 25.0% | $10^{-9}$ to $10^{-11}$ | Acceptable |
| 13 | Pd | 0.3 µm | Pd | 0.3 µm | Pd | 0.3 µm | 4.3% | 26.0% | $10^{-9}$ to $10^{-11}$ | Acceptable |

TABLE 1-continued

| Sealing material | | | | | | Porosity of sealing material | | Results of sealing test | |
|---|---|---|---|---|---|---|---|---|---|
| | | Underlying metal film | | Lid-like metal film | | Densified region | Porous region | Leak rate | |
| No. | Metal powder | Particle size | Metal | Thickness | Metal | Thickness | (peripheral part) | (central part) | (Pa · m³/s) | Evaluation |
| 14 | | | Au | | Au | | 4.5% | 27.0% | $10^{-9}$ to $10^{-11}$ | Acceptable |
| 15 | Pt | 0.3 μm | Pt | 0.3 μm | Pt | 0.3 μm | 5.5% | 28.0% | $10^{-9}$ to $10^{-11}$ | Acceptable |
| 16 | | | Au | | Au | | 6.7% | 29.0% | $10^{-9}$ to $10^{-11}$ | Acceptable |

*[1]No. 1 corresponds to the first embodiment.
*[2]A pressure of 70 MPa was applied as a load in No. 10.
*[3]The inside of the sealed space of the base member could not be evacuated, and thus the leak test could not be conducted..

Table 1 indicates that favorable hermetic sealing properties are obtained with sealing structures having various metal powders of gold, silver, palladium and platinum as sealing materials. However, airtightness is reduced when the metal powder has an excessively large particle size (No. 4). This is because when the metal powder is coarse, a dense compressed product having a low porosity is not formed even though an underlying metal film and a lid-like metal film exist. In addition, even when the metal powder has appropriate physical properties etc., the porosity of the densified region increases, leading to reduction of airtightness (No. 10) unless an appropriate pressurization treatment is performed. As shown in these test examples, control of the porosity of the densified region of the sealing material is important for exhibiting appropriate hermetic sealing properties. In addition, when any of the underlying metal film and the lid-like metal film is absent (Nos. 8 and 9), it was not able to perform evacuation itself for leak rate measurement. It can be said that when the underlying metal film is absent (No. 8), marked leakage occurs at the interface between the sealing material (i.e. metal powder compressed product) and the base member. In addition, it is considered that when the lid-like metal film is absent (No. 9), leakage occurs from the porous region of the sealing material. Thus, it can be said that these metal films are essential constituents.

INDUSTRIAL APPLICABILITY

In the present invention, a predetermined metal powder compressed product is applied as a medium for sealing a through-hole in a method for sealing a sealed space including a through-hole. In the present invention, generation of an outgas, which is a problem in conventional arts such as brazing material welding and anodic bonding, and therefore the through-hole can be sealed at a relatively low temperature without possibility of contaminating the sealed space. A sealing structure according to the present invention can be appropriately formed as a transfer substrate, and is applicable even when a plurality of sealed spaces are set for one base member as in a wafer-level packaging because the sealing structure can be efficiently formed. The present invention is effective for hermetic sealing of MEMS devices such as pressure sensors and acceleration sensors, and various semiconductor devices.

The invention claimed is:
1. A sealing structure comprising: a set of base members forming a sealed space; at least one through-hole with a peripheral part which is formed in at least one of the set of base members, and communicates with the sealed space; and a sealing member that seals the through-hole,
the sealing structure including an underlying metal film on a surface of the base member in which the through-hole is formed, the underlying metal film including a bulk-like metal including at least one of gold, silver, palladium and platinum, the underlying metal film being formed so as to surround the peripheral part of the through-hole,
the sealing member sealing the through-hole while being bonded to the underlying metal film,
the sealing member including: a sealing material which is bonded to the underlying metal film, and includes a compressed product of a metal powder of at least one selected from gold, silver, palladium and platinum, the metal powder having a purity of 99.9% by mass or more; and
a lid-like metal film which is bonded to the sealing material, and includes a bulk-like metal including at least one of gold, silver, palladium and platinum,
the sealing material including: an outer periphery-side densified region that is in contact with the underlying metal film; and a center-side porous region that is in contact with the through-hole,
the densified region having a porosity of 10% or less in terms of an area ratio at any cross-section.
2. The sealing structure according to claim 1, wherein a thickness of the underlying metal film is not less than 0.01 μm and not more than 10 μm.
3. The sealing structure according to claim 2, wherein a thickness of the lid-like metal film is not less than 0.01 μm and not more than 10 μm.
4. The sealing structure according to claim 2, wherein an area of a lateral cross-section of the sealing material is not less than 1.2 times and not more than 6 times an area of a lateral cross-section of the through-hole.
5. The sealing structure according to claim 2, wherein a thickness of the sealing material is not less than 0.1 μm and not more than 10 μm.
6. The sealing structure according to claim 2, wherein the sealing material is formed by compressing a sintered body of the metal powder wherein the metal powder has_an average particle size of not less than 0.01 μm and not more than 1.0 μm.
7. A sealing method for forming the sealing structure defined in claim 2, comprising the steps of:
providing a transfer substrate at a position corresponding to a position of the through-hole of the base member that forms a sealing region, the transfer substrate including the lid-like metal film, and a metal powder sintered body obtained by sintering the metal powder, the metal powder having an average particle size of not less than 0.01 μm and not more than 1.0 μm;

forming the underlying metal film on a surface of the base member provided with the through-hole, in such a manner that the underlying metal film surrounds at least the peripheral part of the through-hole;

superposing the transfer substrate and the base member one on the other so as to be opposed to each other so that the through-hole is sealed with the metal powder sintered body being in contact with the underlying metal film; and pressing the transfer substrate to form the sealing material from the metal powder sintered body, and bond the sealing material to the underlying metal film.

8. The sealing structure according to claim 1, wherein a thickness of the lid-like metal film is not less than 0.01 μm and not more than 10 μm.

9. The sealing structure according to claim 8, wherein an area of a lateral cross-section of the sealing material is not less than 1.2 times and not more than 6 times an area of a lateral cross-section of the through-hole.

10. The sealing structure according to claim 8, wherein a thickness of the sealing material is not less than 0.1 μm and not more than 10 μm.

11. The sealing structure according to claim 8, wherein the sealing material is formed by compressing a sintered body of the metal powder wherein the metal powder has an average particle size of not less than 0.01 μm and not more than 1.0 μm.

12. A sealing method for forming the sealing structure defined in claim 8, comprising the steps of:

providing a transfer substrate at a position corresponding to a position of the through-hole of the base member that forms a sealing region, the transfer substrate including the lid-like metal film, and a metal powder sintered body obtained by sintering the metal powder, the metal powder having an average particle size of not less than 0.01 μm and not more than 1.0 μm;

forming the underlying metal film on a surface of the base member provided with the through-hole, in such a manner that the underlying metal film surrounds at least the peripheral part of the through-hole;

superposing the transfer substrate and the base member one on the other so as to be opposed to each other so that the through-hole is sealed with the metal powder sintered body being in contact with the underlying metal film; and pressing the transfer substrate to form the sealing material from the metal powder sintered body, and bond the sealing material to the underlying metal film.

13. The sealing structure according to claim 1, wherein an area of a lateral cross-section of the sealing material is not less than 1.2 times and not more than 6 times an area of a lateral cross-section of the through-hole.

14. The sealing structure according to claim 1, wherein a thickness of the sealing material is not less than 0.1 μm and not more than 10 μm.

15. The sealing structure according to claim 1, wherein the sealing material is formed by compressing a sintered body of the metal powder wherein the metal powder has an average particle size of not less than 0.01 μm and not more than 1.0 μm.

16. A sealing method for forming the sealing structure defined in claim 1, comprising the steps of:

providing a transfer substrate at a position corresponding to a position of the through-hole of the base member that forms a sealing region, the transfer substrate including the lid-like metal film, and a metal powder sintered body obtained by sintering the metal powder, the metal powder having an average particle size of not less than 0.01 μm and not more than 1.0 μm;

forming the underlying metal film on a surface of the base member provided with the through-hole, in such a manner that the underlying metal film surrounds at least the peripheral part of the through-hole;

superposing the transfer substrate and the base member one on the other so as to be opposed to each other so that the through-hole is sealed with the metal powder sintered body being in contact with the underlying metal film; and pressing the transfer substrate to form the sealing material from the metal powder sintered body, and bond the sealing material to the underlying metal film.

17. The sealing method according to claim 16, wherein at least one of the transfer substrate and the base member is pressed while being heated at not lower than 80° C. and not higher than 300° C.

18. A transfer substrate to be used in the sealing method defined in claim 17, comprising;

a substrate;

a projection portion formed on the substrate at a position corresponding to a position of the through-hole of the base member;

the lid-like metal film which is formed on at least the projection portion, and includes the bulk-like metal; and the metal powder sintered body which is formed on the lid-like metal film, and obtained by sintering the metal powder.

19. A transfer substrate to be used in the sealing method defined in claim 16, comprising;

a substrate;

a projection portion formed on the substrate at a position corresponding to a position of the through-hole of the base member;

the lid-like metal film which is formed on at least the projection portion, and includes the bulk-like metal; and the metal powder sintered body which is formed on the lid-like metal film, and obtained by sintering the metal powder.

20. The transfer substrate according to claim 19, comprising a transfer film which is formed between the projection portion and the lid-like metal film, includes chromium, titanium, tungsten and an alloy of these metals, and has an oxide film formed on a surface of the transfer film facing the lid-like metal film.

* * * * *